(12) United States Patent
Kutney (10) Patent No.: US 9,982,786 B2
(45) Date of Patent: May 29, 2018

(54) VALVE WITH ADJUSTABLE HARD STOP (71) Applicant: APPLIED MATERIALS, INC., Santa Clara, CA (US)

(72) Inventor: Michael C. Kutney, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 911 days.

(21) Appl. No.: 14/291,828

(22) Filed: May 30, 2014

(65) Prior Publication Data
US 2015/0345645 A1    Dec. 3, 2015

(51) Int. Cl.
*F16K 1/52* (2006.01)
*F16K 37/00* (2006.01)
*C23C 16/44* (2006.01)
*C23C 16/455* (2006.01)

(52) U.S. Cl.
CPC .......... *F16K 1/523* (2013.01); *C23C 16/4412* (2013.01); *C23C 16/45561* (2013.01); *F16K 37/0041* (2013.01); *Y10T 29/49407* (2015.01)

(58) Field of Classification Search
CPC ............... F16K 1/523; F16K 37/0041; Y10T 29/49407; C23C 16/4412; C23C 16/45561
See application file for complete search history.

(56) References Cited

U.S. PATENT DOCUMENTS

| | | | | |
|---|---|---|---|---|
| 1,420,663 A | * | 6/1922 | Maxwell | F16K 1/44 137/630.18 |
| 1,689,236 A | * | 10/1928 | Fraser, Jr. | F16K 35/025 116/277 |
| 1,821,206 A | * | 9/1931 | Caswell | B67D 7/42 137/630.14 |
| 1,936,301 A | * | 11/1933 | Hansen | F16K 1/523 137/553 |
| 3,023,093 A | * | 2/1962 | Hughes | F16K 31/1262 137/505 |
| 3,215,089 A | * | 11/1965 | Hoffmann | F04F 5/461 137/413 |
| 3,253,612 A | * | 5/1966 | Curatola | F16K 1/523 137/553 |
| 3,262,372 A | * | 7/1966 | Foell | B23Q 5/26 60/427 |
| 3,409,271 A | * | 11/1968 | Kallenbach | F16K 1/38 251/265 |
| 3,472,014 A | * | 10/1969 | Taylor | D01H 1/305 137/624.11 |
| 3,486,734 A | * | 12/1969 | Tooley | F16B 39/04 251/265 |

(Continued)

FOREIGN PATENT DOCUMENTS

FR    2228996 A1 * 12/1974 ............... F16K 1/32

*Primary Examiner* — Jeffrie R Lund
(74) *Attorney, Agent, or Firm* — Moser Taboada; Alan Taboada (57) ABSTRACT

Embodiments of valves having adjustable hard stops and methods of use thereof are provided herein. The adjustable valve includes a valve body including an inlet and an outlet; a valve member that is moveable between a fully closed position and a fully open position to selectively allow or prevent flow from the inlet to the outlet; and an adjustable hard stop to limit the fully open position of the valve to an adjusted fully open position.

20 Claims, 6 Drawing Sheets

(56) References Cited

U.S. PATENT DOCUMENTS

| | | | | |
|---|---|---|---|---|
| 3,672,791 A * | 6/1972 | Zimmerly | F04B 9/1235 | 210/167.11 |
| 3,913,883 A * | 10/1975 | Irwin | E21B 34/04 | 137/236.1 |
| 4,062,332 A * | 12/1977 | Perr | F02D 9/06 | 123/323 |
| 4,154,259 A * | 5/1979 | Ellis | E03L 39/04 | 137/298 |
| 4,696,325 A * | 9/1987 | Magee | A62C 37/00 | 137/552 |
| 4,869,459 A * | 9/1989 | Bourne | F16K 31/1221 | 251/280 |
| 4,967,792 A * | 11/1990 | Magee | F16K 37/0033 | 137/552 |
| 5,007,330 A * | 4/1991 | Scobie | F15B 15/125 | 277/589 |
| 5,144,977 A * | 9/1992 | Eggerton | F16K 37/0033 | 137/554 |
| 5,361,679 A * | 11/1994 | Foster | F15B 13/0402 | 137/596.15 |
| 5,467,967 A * | 11/1995 | Gillooly | E03C 1/041 | 251/285 |
| 6,568,422 B2 * | 5/2003 | Niessen | F15B 15/065 | 137/385 |
| 9,404,180 B2 * | 8/2016 | Hara | C23C 16/16 | |
| 9,556,979 B2 * | 1/2017 | Williams | F16L 19/061 | |
| 2003/0164163 A1 * | 9/2003 | Lei | F01L 1/146 | 123/568.14 |
| 2003/0223882 A1 * | 12/2003 | Greene, Jr. | F04B 51/00 | 417/212 |
| 2004/0118274 A1 * | 6/2004 | Morrison | F01L 25/02 | 91/303 |
| 2004/0244850 A1 * | 12/2004 | Browne | F16K 7/14 | 137/625.5 |
| 2006/0191777 A1 * | 8/2006 | Glime | F16K 1/523 | 200/81 R |
| 2011/0048556 A1 * | 3/2011 | Carter | F16K 31/122 | 137/559 |
| 2015/0345645 A1 * | 12/2015 | Kutney | F16K 1/523 | 454/49 |
| 2017/0030382 A1 * | 2/2017 | Sujanani | F15B 15/26 | |

\* cited by examiner

VALVE WITH ADJUSTABLE HARD STOP

FIELD

Embodiments of the present disclosure generally relate to substrate processing equipment.

BACKGROUND

Formation of devices on substrates requires multiple fabrication processes to be performed in various substrate processing chambers. For example, processes such as atomic layer deposition (ALD), physical vapor deposition (PVD), chemical vapor deposition (CVD), etching, etc., may be used to form or remove various layers on a substrate. These processes typically require one or more gases to be flowed into the substrate processing chambers during processing.

For a given process, many substrate processing chambers may be used to process substrates in parallel to enhance throughput. However, although the substrate processing chambers used for a particular process (e.g., PVD, CVD, etc.) are substantially the same for a particular process, variability still exists from one chamber to another. The inventors have observed that this variability can affect the variability of the flow of process gases within the substrate processing chambers and the chamber pressures of the substrate processing chambers.

Therefore, the inventors have provided embodiments of adjustable valves for use in substrate processing chambers and methods of use thereof.

SUMMARY

Embodiments of valves having adjustable hard stops and methods of use thereof are provided herein. In some embodiments, an adjustable valve includes a valve body including an inlet and an outlet; a valve member that is moveable between a fully closed position and a fully open position to selectively allow or prevent flow from the inlet to the outlet; and an adjustable hard stop to limit the fully open position of the valve to a desired position.

In some embodiments a substrate processing chamber is provided, including: a chamber body having an inner volume; a substrate support disposed within the inner volume; an exhaust valve coupled to an exhaust line to flow a process gas to the exhaust line; and the adjustable valve of any of the embodiments described herein coupled to the exhaust line in parallel with the exhaust valve to flow the process gas to the exhaust line at a first flow rate or to control a first chamber pressure to match a desired pressure.

In some embodiments, a substrate processing system is provided, including: the substrate processing chamber as described herein; and a second substrate processing chamber having a second exhaust valve coupled to a second exhaust line and a second adjustable valve coupled to the second exhaust line in parallel with the second exhaust valve to flow a second process gas to the second exhaust line at a second flow rate or to control a second chamber pressure to match the desired pressure.

In some embodiments, an adjustable valve includes: a valve body including an inlet and an outlet; a valve member that is moveable between a fully closed position and a fully open position to selectively allow or prevent flow from the inlet to the outlet; a moveable stop coupled to the valve member; and a bracket disposed above the valve member to limit movement of the valve member beyond an adjusted fully open position.

In some embodiments, a method for adjusting an adjustable valve of a first substrate processing chamber includes: opening the adjustable valve to a fully open position; measuring at least one of a first flow rate of a flow of gas through the adjustable valve and a first chamber pressure while in the fully open position; comparing the first flow rate to a desired flow rate or the first chamber pressure to a desired pressure; and adjusting the fully open position so that the first flow rate is equal to the desired flow rate or the first chamber pressure is equal to the desired pressure.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of valves having adjustable hard stops and methods of use thereof are provided herein. Embodiments of the inventive adjustable valve may advantageously decrease discrepancies between processed substrates by more accurately controlling the flow rate of process gases through the adjustable valve to compensate for chamber-to-chamber variations. Embodiments of the inventive adjustable valve may advantageously be easily retrofitted to existing processing systems, thereby avoiding unnecessary and costly modification of existing processing systems.

Figure 1:
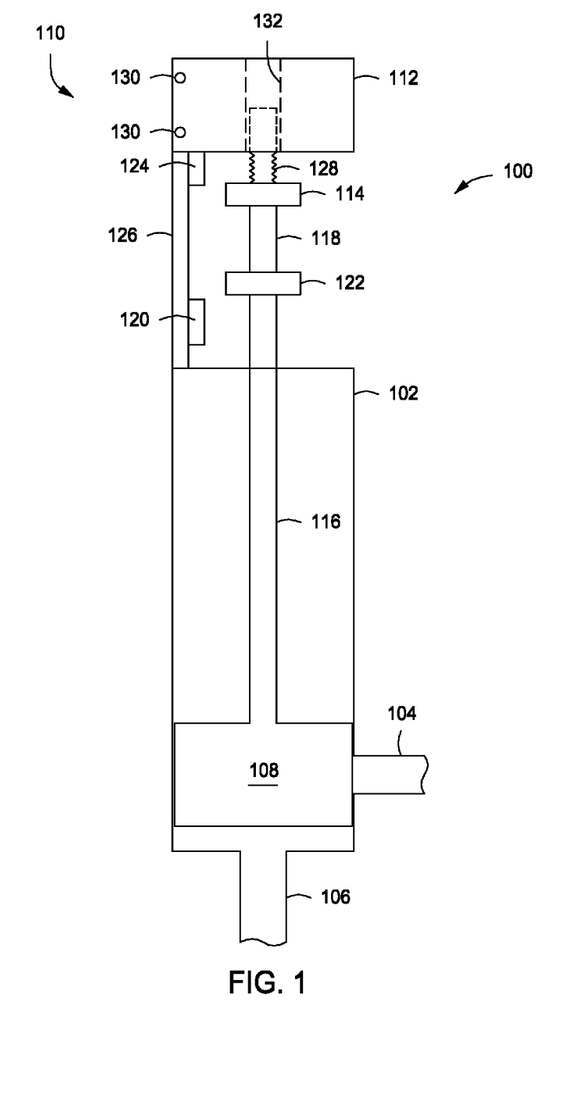
FIG. 1 depicts an adjustable valve in accordance with some embodiments of the present disclosure.

FIG. 1 depicts an adjustable valve 100 in accordance with some embodiments of the present disclosure. The adjustable valve 100 is a two-position, or "on/off" valve that is operable in two states: "fully open" and "fully closed". The adjustable valve 100 generally includes a valve body 102 with two ports (referred to herein as an inlet 104 and an outlet 106), which define a gas flow path through the valve body 102. Although the outlet 106 is depicted in FIG. 1 as offset by 90 degrees from the inlet 104, the outlet 106 may alternatively be disposed opposite the inlet 104 or in any other position to facilitate flow of gases from the inlet 104 to the outlet 106. Moreover, although the inlet 104 and the outlet 106 are named as such, the flow could be reversed such that the inlet 104 may function as the outlet and the outlet 106 may function as the inlet.

A valve member 108 is movably disposed within the valve body 102 between a fully closed position and a fully open position. In the fully closed position (shown in FIG. 1), the valve member 108 completely blocks off the inlet 104 from the outlet 106. In the fully open position, the valve member 108 is disposed in a position that minimizes any obstruction between the inlet 104 and the outlet 106 due to the valve member 108. Thus, in the fully open position, gas flows from the inlet 104 to the outlet 106 at a maximum flow rate and a chamber pressure is at its lowest point.

A valve stem 116 is coupled to the valve member 108 and extends through and out of the valve body 102. The valve stem 116 facilitates controlling the position of the valve member 108. The valve stem 116 and the valve member 108 may be unitary or formed of separate components.

An adjustable hard stop 110 is provided to limit the range of motion of the valve member 108. Specifically, the adjustable hard stop 110 limits how far the valve member 108 can move toward the open position. Thus, the amount of interference that the valve member 108 provides between the inlet 104 and the outlet 106 may be controlled, thereby adjusting the resultant flow rate when the valve member 108 is in the fully open position. As a result, a flow rate of process gases through the adjustable valve 100 can be controlled to a desired flow rate that may be different than the flow rate that would otherwise be provided when the valve is in a fully open position without using the adjustable hard stop. Thus, the desired flow rate is less than or equal to the maximum flow rate of the adjustable valve 100.

The adjustable hard stop 110 is generally coupled to the valve body 102. For example, in some embodiments, the adjustable hard stop 110 includes a bracket 112 and linkage arm 126 that supports the bracket 112 in a fixed position away from an end of the valve body 102 (e.g., the end of the valve body that the valve stem 116 extends from). The bracket 112 may be coupled to the linkage arm 126 using one or more fixation elements 130 (two shown in FIG. 1).

A moveable stop 114 may be mounted on an upper portion 118 of the valve stem 116 that is disposed outside of the valve body 102. The bracket 112 includes a hole 132 through which a portion of the upper portion 118 passes. In the fully closed position of the valve member 108, the moveable stop 114 is located below the bracket 112. In the adjusted fully open position, the moveable stop 114 abuts a bottom surface of the bracket 112, thereby preventing further movement of the valve member 108 toward the bracket 112. In some embodiments, the adjusted fully open position is less than the fully open position so that the valve member 108 at least partially obstructs the flow path between the inlet 104 and the outlet 106. However, the moveable stop 114 is adjustable enough to use the fully open position in which the valve member 108 does not obstruct the flow path between the inlet 104 and the outlet 106 at all. Thus, the flow rate through the adjustable valve 100 in the adjusted fully open position can be less than or equal to the maximum flow rate in the fully open position.

The moveable stop 114 can be adjusted in any suitable manner. For example, in some embodiments, the upper portion 118 of the valve stem 116 may include a threaded portion 128 and the moveable stop 114 may be a nut with corresponding threads. To adjust the fully open position of the valve member 108, the moveable stop 114 may be rotated (clockwise or counterclockwise) to move the moveable stop 114 along the upper portion 118. To prevent inadvertent movement once set in a desired location, the nut may be locked in position along the threaded portion 128. For example, the nut may be a locking nut (e.g., a nut with a captured polymer washer that provides additional friction along the threaded portion 128) or a pair of nuts that may be jammed together to prevent inadvertent movement of the nuts once set, or some other suitable locking mechanism. Alternatively, the moveable stop 114 may be any adjustable element that can be moved along and held in position on the upper portion 118. For example, the moveable stop 114 may be a clamp that can be placed at the desired position and clamped onto the upper portion 118 with sufficient force to remain in position during cycling of the adjustable valve 100.

Figure 2:
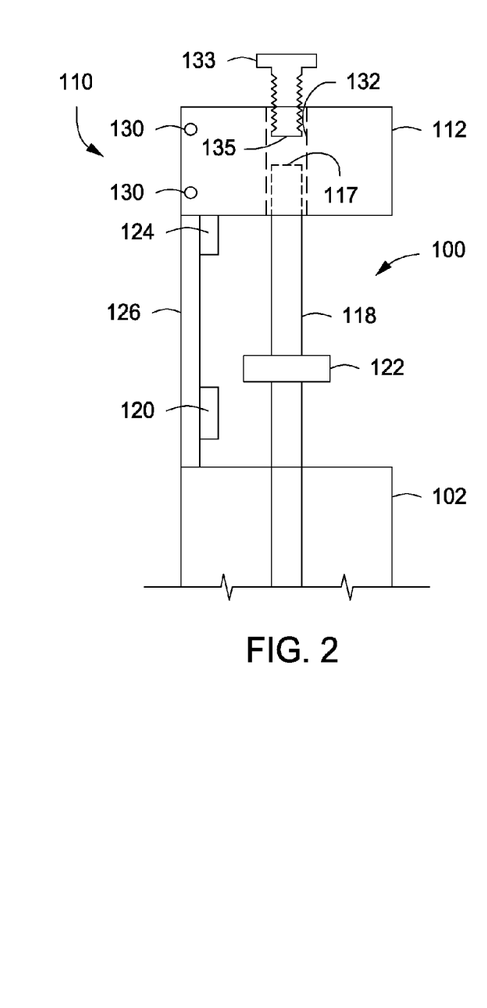
FIG. 2 depicts an adjustable valve in accordance with some embodiments of the present disclosure.

In some embodiments, the hole 132 is threaded to receive a correspondingly threaded bolt 133, as depicted in FIG. 2. The bolt 133 may be turned to dispose it at a predetermined location along the hole 132. In the adjusted fully open position, a bottom surface 135 of the bolt 133 abuts an upper surface 117 of the valve stem 116, thereby preventing further movement of the valve member 108 toward the bracket 112. In such a configuration, the moveable stop 114 and the threaded portion 128 need not be included.

Figure 3:
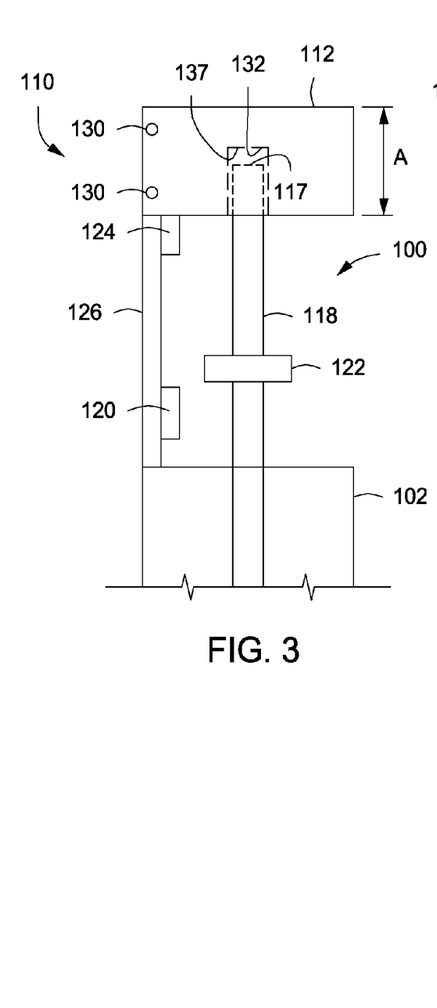
FIG. 3 depicts an adjustable valve in accordance with some embodiments of the present disclosure.
Figure 4:
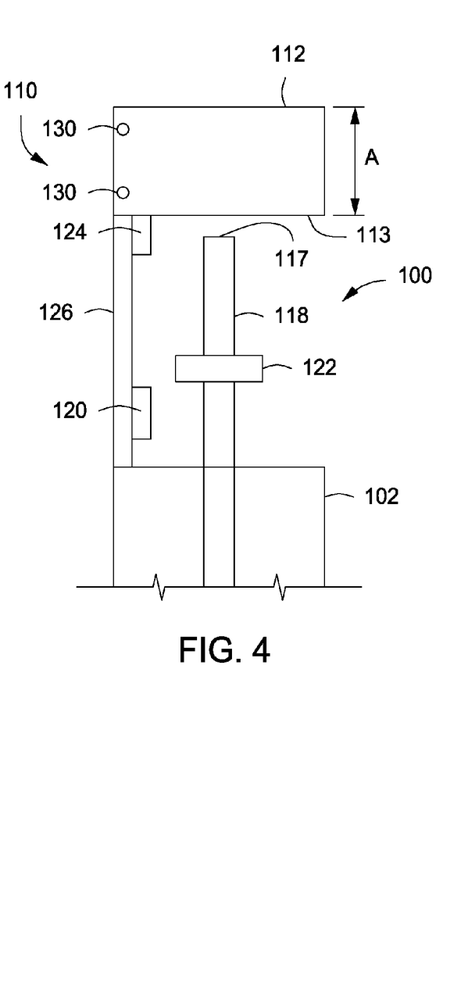
FIG. 4 depicts an adjustable valve in accordance with some embodiments of the present disclosure.

In some embodiments, the hole 132 may be a blind hole, as depicted in FIG. 3. In some embodiments, the bracket 112 may alternatively not include a hole at all, as depicted in FIG. 4. In these embodiments, the bracket 112 may be moveable along the linkage arm 126 in a direction indicated by arrow A to a desired position. The fixation elements 130 hold the bracket 112 at the desired position. In embodiments in which the hole 132 is a blind hole, the adjusted fully open position is defined as the position in which a top surface 117 of the valve stem 116 abuts a lower surface 137 of the blind hole. In embodiments in which the bracket 112 does not include a hole, the adjusted fully open position is defined as the position in which an upper surface 117 of the valve stem 116 abuts a lower surface 113 of the bracket 112. In such configurations, the moveable stop 114 and the threaded portion 128 need not be included.

Returning to FIG. 1, the adjustable valve 100 may also include a position sensor 120 to detect a position of the valve member 108. In some embodiments, the adjustable valve 100 may include a second moveable stop 122 that is detected by the position sensor 120 to indicate that the valve member 108 is in the fully closed position. The position sensor 120 may be a switch that is actuated by the second moveable stop 122 to indicate that the valve member 108 has reached the fully closed position. In some embodiments, the adjustable valve 100 may also include a second position sensor 124 to detect a position of the moveable stop 114, indicating that the valve member 108 is in the adjusted fully open position.

Figure 5:
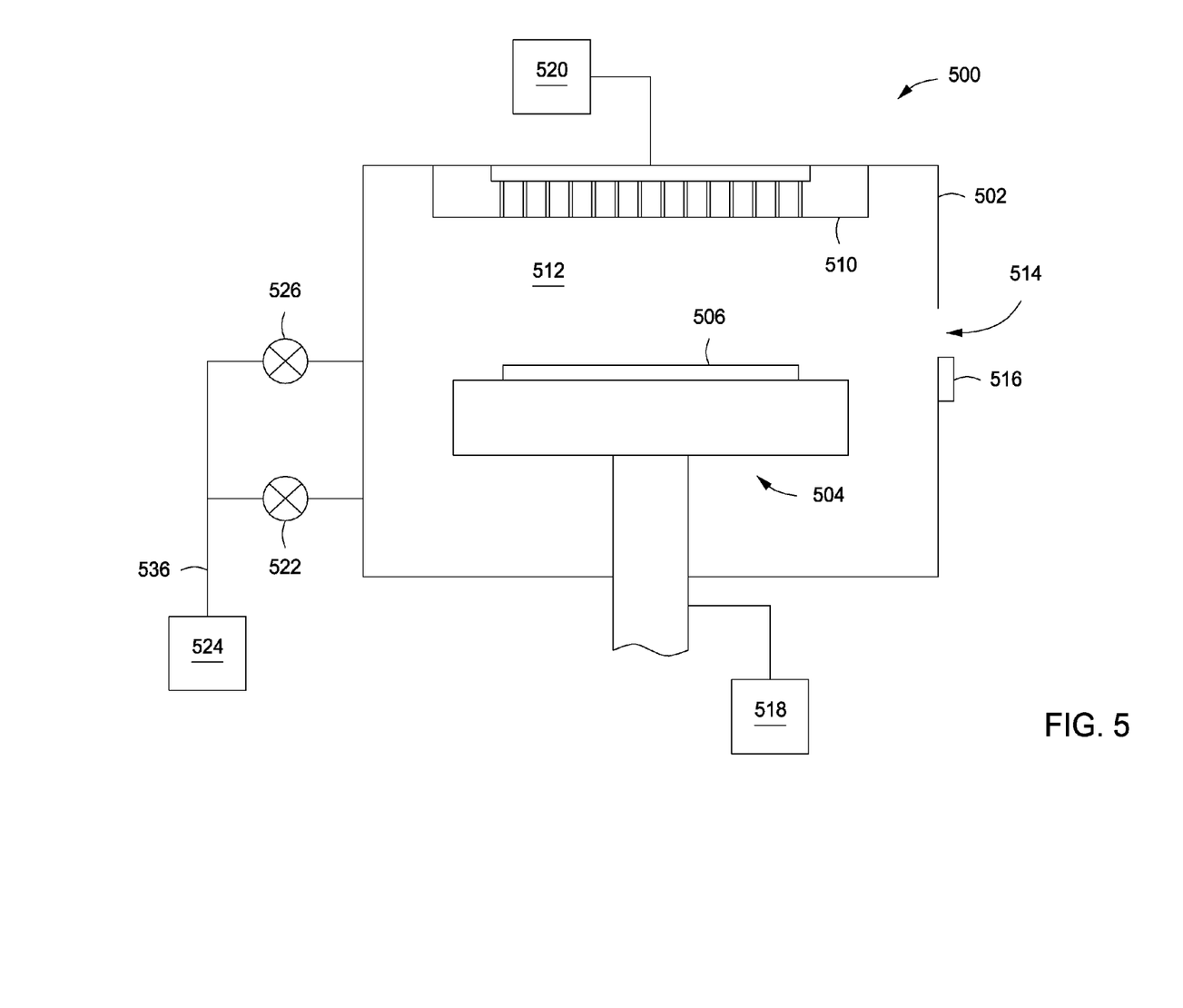
FIG. 5 depicts a substrate processing chamber in accordance with some embodiments of the present disclosure.

FIG. 5 depicts a substrate processing chamber 500 suitable for use with the adjustable valve 100 in accordance with some embodiments of the present disclosure. The substrate processing chamber 500 may be any substrate processing chamber suitable for performing one or more substrate processes, for example, deposition process such as chemical vapor deposition (CVD), physical vapor deposition (PVD), atomic layer deposition (ALD), or etching processes such as layer removal or preclean and the like. In embodiments where the substrate processing chamber is a CVD chamber, the CVD chamber may be any suitable CVD chamber known in the art. For example, the CVD chamber may be a standalone substrate processing chamber or a part of a cluster tool, such as one of the CENTURA®, PRODUCER®, or ENDURA® cluster tools available from Applied Materials, Inc. of Santa Clara, Calif.

In some embodiments, the substrate processing chamber 500 may generally include a chamber body 502, a substrate support 504 for supporting a substrate 506 and one or more gas inlets for providing one or more process gases to an inner volume 512 of the chamber body 502. A showerhead 510 is illustratively depicted in FIG. 5. Alternatively or in combination, other gas inlets may be provided such as nozzles or inlets disposed in the ceiling or on the sidewalls of the substrate processing chamber 500 or at other locations suitable for providing gases as desired to the substrate processing chamber 500, such as the base of the chamber body 502, the periphery of the substrate support 504, or the like.

The chamber body 502 may include one or more openings (one opening 514 shown) to allow for the substrate 506 to be provided to, and removed from, the substrate processing chamber 500. The opening 514 may be selectively sealed via a slit valve 516, or other mechanism for selectively providing access to the inner volume 512 of the chamber body 502 through the opening 514. In some embodiments, the substrate support 504 may be coupled to a rotation and/or lift mechanism 518 that may control the rotation and/or the vertical position of the substrate support 504 between a lower position (as shown) suitable for transferring substrates into and out of the chamber via the opening 514 and an upper position suitable for processing.

The one or more gas inlets (e.g., showerhead 510) may be coupled to a gas source 520 for providing one or more process gases for carrying out processes in the substrate processing chamber 500. The substrate processing chamber 500 further includes a valve 522 coupled to an exhaust line 536, which may be coupled to a pump 524 for removing process gases, purge gases, processing byproducts, and the like from the substrate processing chamber 500. In some embodiments, the valve 522 may be a gate valve that allows process gases to flow from the inner volume 512 to the pump 524. However, the valve 522 may alternatively include a solenoid valve, a butterfly valve, or any other two position valve (i.e., open/closed).

In addition to the valve 522, an adjustable valve 526 (such as the adjustable valve 100 of FIG. 1) is also coupled to the pump 524 as a bypass to the valve 522. The adjustable valve 526 is coupled to the pump 524 in parallel with the valve 522. As explained above with respect to FIG. 1, the adjustable valve 526 may be used to flow process gases or exhaust from the inner volume 512 of the substrate processing chamber 500 to the pump 524 at a desired flow rate.

Providing the substrate processing chamber 500 with the adjustable valve 526 as discussed above advantageously facilitates more accurate control, uniformity, and repeatability of the flow rate of process gases from the process chamber at different magnitudes of flow. For example, the valve 522 may be open (with the adjustable valve 526 open or closed) during high flow rate processes, such as about 1000 sccm or greater, and the valve 522 may be closed and the adjustable valve 526 open during low flow rate processes, such as about 100 sccm or less. In some embodiments, the adjustable valve advantageously facilitates more accurate control of a chamber pressure in the process chamber. For example, the valve 522 may be may be closed and the adjustable valve 526 open during low flow and high or low pressure processes, such as about 10-500 mT.

Figure 6:
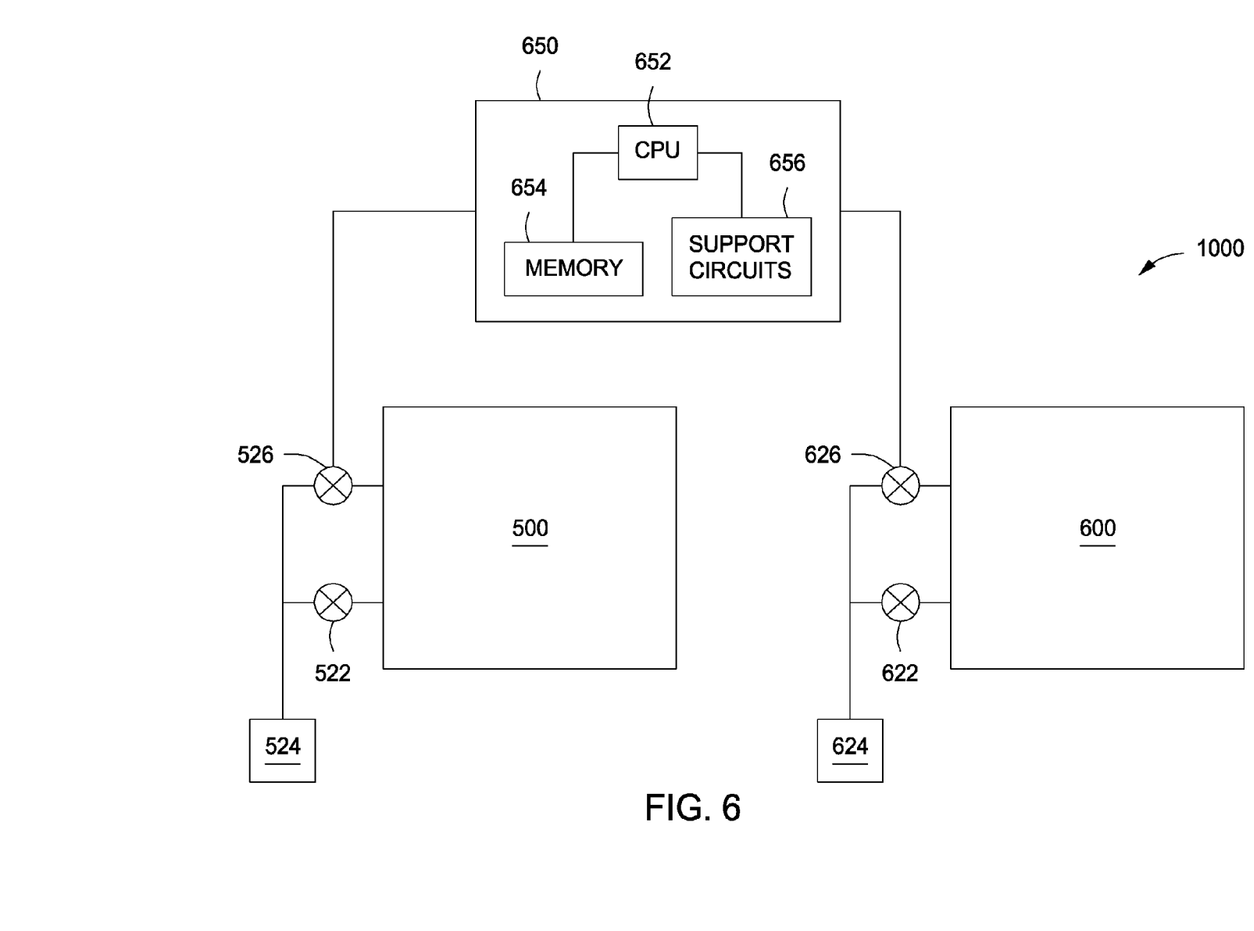
FIG. 6 depicts a substrate processing system in accordance with some embodiments of the present disclosure.

In addition, when multiple substrate processing chambers are used to run similar processes, substrate processing chambers having the adjustable valve 100 may be used to advantageously more closely match performance of the substrate processing chambers. For example, FIG. 6 depicts a substrate processing system 1000 in accordance with some embodiments of the present disclosure. The substrate processing system may include the substrate processing chamber 500 and a second substrate processing chamber 600 that is identical to the substrate processing chamber 500. The second substrate processing chamber 600 includes the same elements as the substrate processing chamber 500, such as a second valve 622, a second adjustable valve 626, and a second pump 624. The second adjustable valve 626 also functions in the same manner as described above with respect to the adjustable valve 100 shown in FIGS. 1-4. Although FIG. 6 depicts two substrate processing chambers, the substrate processing system 1000 may include any number of substrate processing chambers. In addition, the substrate processing chambers 500, 600 may be standalone chambers or part of a multi-chamber substrate processing tool (e.g., multiple substrate processing chambers coupled to one or more vacuum transfer chambers, such as the CENTURA®, ENDURA®, or PRODUCER® lines of equipment available from Applied Materials, Inc., of Santa Clara, Calif.).

Figure 7:
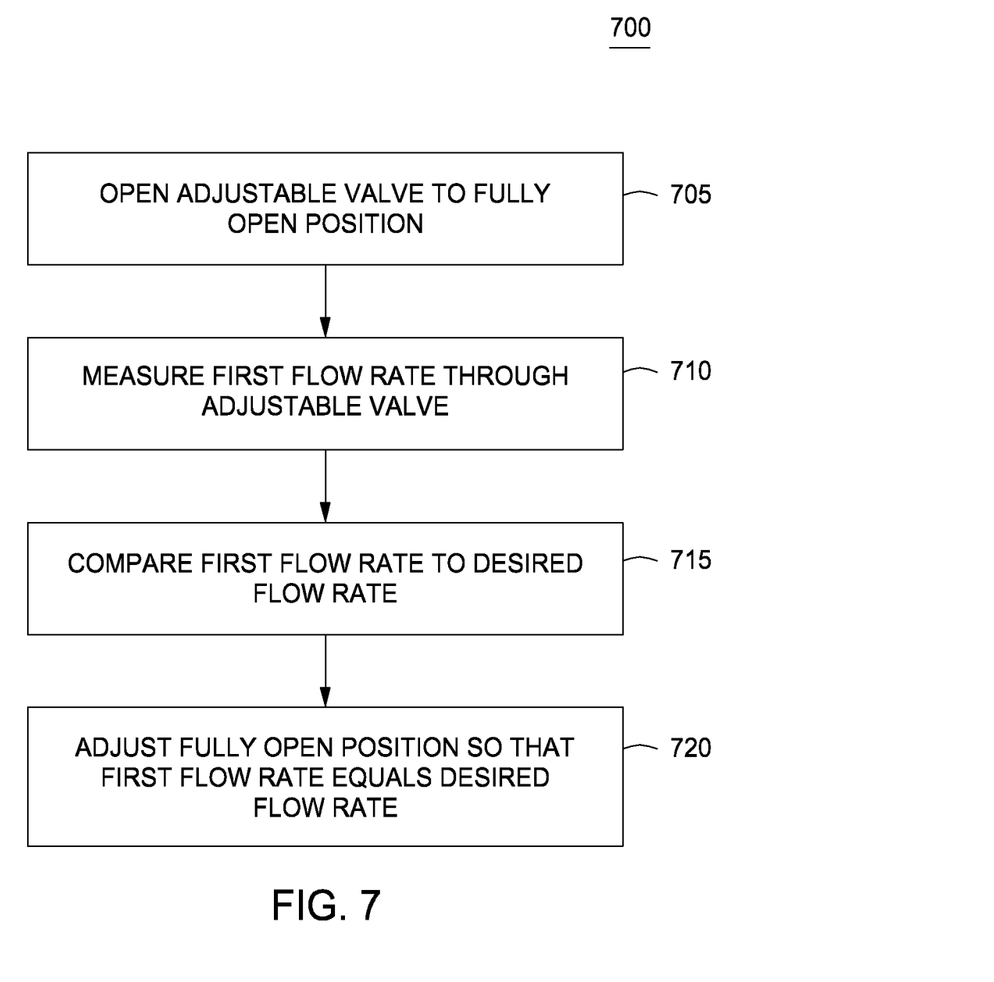
FIG. 7 depicts a flow diagram illustrating a method for adjusting a valve in accordance with some embodiments of the present disclosure.

FIG. 7 depicts a flowchart illustrating a method 700 for adjusting an adjustable valve in accordance with some embodiments of the present disclosure. At 705, the adjustable valve 526 is opened to an initial fully open position. In the initial fully open position, the valve member 108 does not obstruct the flow path between the inlet 104 and the outlet 106 of the adjustable valve. At 710, a first flow rate of gas through the adjustable valve 526 is measured. The flow rate may be measured using any suitable technique. At 715, the measured first flow rate is compared to a desired flow rate. In some embodiments, the desired flow rate is a predetermined flow rate for example, determined by modeling, empirical calculations, or the like. In some embodiments, the desired flow rate is a predetermined flow rate equal to the flow rate in a different substrate process chamber, for example, through an adjustable valve of a different chamber of a substrate processing system (such as the substrate processing system 1000 of FIG. 3). At 720, the initial fully open position is adjusted to an adjusted fully open position so that the first flow rate is substantially equal to the desired flow rate. As used herein, "substantially equal to" means within 1 percent or less of the desired flow rate.

Figure 8:
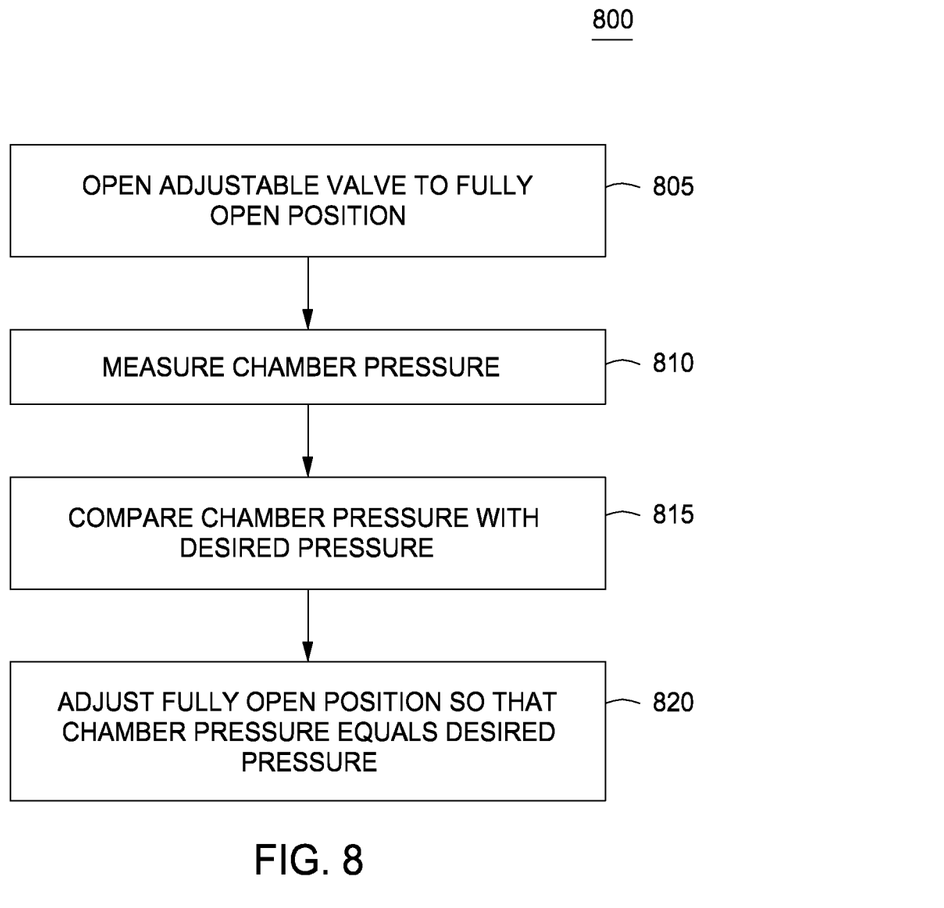
FIG. 8 depicts a flow diagram illustrating a method for adjusting a valve in accordance with some embodiments of the present disclosure.

FIG. 8 depicts a flowchart illustrating a method 800 for adjusting an adjustable valve in accordance with some embodiments of the present disclosure. At 805, the adjustable valve 526 is opened to an initial fully open position. In the initial fully open position, the valve member 108 does not obstruct the flow path between the inlet 104 and the outlet 106 of the adjustable valve. At 810, a chamber pressure of the substrate processing chamber is measured. The chamber pressure may be measured using any suitable technique. At 815, the measured chamber pressure is compared to a desired pressure. In some embodiments, the desired pressure is a predetermined pressure for example, determined by modeling, empirical calculations, or the like. In some embodiments, the desired pressure is a predetermined pressure equal to the chamber pressure in a different substrate processing chamber of a substrate processing system (such as the substrate processing system 1000 of FIG.

3). At 820, the initial fully open position is adjusted to an adjusted fully open position so that the chamber pressure is substantially equal to the desired pressure. As used herein, "substantially equal to" means within 1 percent or less of the desired pressure.

The methods 700 and 800 may be performed for a single substrate processing chamber, or for every substrate processing chamber in a substrate processing system to ensure that the flow rates of gases through the adjustable valves or the chamber pressures of all of the corresponding substrate processing chambers are substantially equal.

The embodiments of the present disclosure can be used in any application that requires switching from a high flow operation to a low flow operation or high pressure to low pressure or vice-versa. For example, the adjustable valve and method according to the embodiments of the present disclosure can be used in other types of processing chambers (e.g., CVD, ALD, etc.) in which fast transitions are needed between different pressure regimes. For example, although the adjustable valve 526 is described above in use as an outlet of the substrate processing chamber 500, the adjustable valve 526 could alternatively or in combination be used as an inlet to provide gases at a desired flow rate to the substrate processing chamber 500. For example, a high flow rate gas inlet (not shown) and the adjustable valve 526 may be coupled to the gas source 520 to selectively provide the process gas to the substrate processing chamber during high flow rate and low flow rate processes, while providing enhanced control over the repeatability of the flow rate from run to run in the substrate processing chamber as well as the matching of flow rates between different substrate processing chambers, as described above. As mentioned above, both the valve 522 and the adjustable valve 526 may both be open simultaneously to increase the overall conductance and reduce the chamber pressure at a higher rate. Such functionality may be utilized for example, to more quickly evacuate the chamber. Also, opening both valves simultaneously decreases the cycles (open/closed) that the valves experience, thereby prolonging the life of the valves.

While the foregoing is directed to embodiments of the present disclosure, other and further embodiments of the disclosure may be devised without departing from the basic scope thereof.

The invention claimed is:

1. An adjustable valve, comprising:
a valve body including an inlet and an outlet;
a valve member that is moveable between a fully closed position and a fully open position to selectively allow or prevent flow from the inlet to the outlet; and
an adjustable hard stop to limit the fully open position of the adjustable valve to an adjusted fully open position, wherein the adjustable hard stop includes a bracket coupled to the valve body in a fixed position via a linkage arm and disposed above the valve member to limit movement of the valve member beyond the adjusted fully open position,
wherein the adjustable valve is a two position valve.

2. The adjustable valve of claim 1, wherein the adjustable hard stop comprises:
a moveable stop coupled to the valve member.

3. The adjustable valve of claim 2, further comprising:
a valve stem coupled to the valve member and having a threaded portion, wherein the moveable stop is a nut disposed on and moveable along the threaded portion of the valve stem.

4. The adjustable valve of claim 2, further comprising:
a position sensor to detect a position of the valve member.

5. The adjustable valve of claim 4, wherein the position sensor comprises a switch and a nut to contact the switch when the valve member is in the fully closed position.

6. The adjustable valve of claim 5, wherein the position sensor comprises a second switch, and wherein the moveable stop contacts the second switch when the valve member is in the adjusted fully open position.

7. A substrate processing chamber, comprising:
a chamber body having an inner volume;
a substrate support disposed within the inner volume;
an exhaust valve coupled to an exhaust line to flow a process gas to the exhaust line; and
the adjustable valve of claim 1 coupled to the exhaust line in parallel with the exhaust valve to flow the process gas to the exhaust line at a first flow rate or to control a first chamber pressure to match a desired pressure.

8. The substrate processing chamber of claim 7, wherein the exhaust valve is a two position valve.

9. A substrate processing system, comprising:
the substrate processing chamber of claim 7; and
a second substrate processing chamber having a second exhaust valve coupled to a second exhaust line and a second adjustable valve coupled to the second exhaust line in parallel with the second exhaust valve to flow a second process gas to the second exhaust line at a second flow rate or to control a second chamber pressure to match the desired pressure, wherein the second adjustable valve includes all the same elements as the adjustable valve recited in claim 1.

10. The substrate processing system of claim 9, wherein at least one of the adjustable valve and the second adjustable valve are adjusted so that the first flow rate and the second flow rate are substantially equal or the first chamber pressure and the second chamber pressure are substantially equal.

11. The substrate processing system of claim 10, wherein the first flow rate and the second flow rate are substantially equal to a desired flow rate.

12. The substrate processing system of claim 11, wherein the desired flow rate is a predetermined flow rate, and wherein the desired pressure is a predetermined pressure.

13. The substrate processing system of claim 11, wherein the desired flow rate is one of the first flow rate or the second flow rate, and wherein the desired pressure is one of the first chamber pressure or the second chamber pressure.

14. An adjustable valve, comprising:
a valve body including an inlet and an outlet;
a valve member that is moveable between a fully closed position and a fully open position to selectively allow or prevent flow from the inlet to the outlet;
a moveable stop coupled to the valve member; and
a bracket coupled to the valve body in a fixed position via a linkage arm and disposed above the valve member to limit movement of the valve member beyond an adjusted fully open position,
wherein the adjustable valve is a two position valve.

15. An adjustable two position valve, comprising:
a valve body including an inlet and an outlet;
a valve member having two positions, a fully closed position and a fully open position, to selectively prevent or allow flow from the inlet to the outlet; and
an adjustable hard stop to limit the fully open position of the adjustable two position valve to an adjusted fully open position such that the two positions are the fully closed position and either the adjusted fully open position or the fully open position.

16. The adjustable valve of claim 15, wherein the adjustable hard stop comprises:

a moveable stop coupled to the valve member; and a bracket disposed above the valve member to limit movement of the valve member beyond the adjusted fully open position.

17. The adjustable valve of claim 16, further comprising:

a valve stem coupled to the valve member and having a threaded portion, wherein the moveable stop is a nut disposed on and moveable along the threaded portion of the valve stem.

18. The adjustable valve of claim 16, further comprising:

a position sensor to detect a position of the valve member.

19. The adjustable valve of claim 18, wherein the position sensor comprises a switch and a nut to contact the switch when the valve member is in the fully closed position.

20. The adjustable valve of claim 19, wherein the position sensor comprises a second switch, and wherein the moveable stop contacts the second switch when the valve member is in the adjusted fully open position.

* * * * *